United States Patent [19]

Farrell

[11] 3,742,316

[45] June 26, 1973

[54] WIDE TEMPERATURE RANGE ELECTRONIC DEVICE WITH LEAD ATTACHMENT

[75] Inventor: Richard Farrell, Lowell, Mass.

[73] Assignee: The United States of America as represented by the Administrator of the National Aeronautics and Space Administration.

[22] Filed: Jan. 28, 1972

[21] Appl. No.: 221,833

Related U.S. Application Data

[62] Division of Ser. No. 868,775, Oct. 23, 1969, Pat. No. 3,665,589.

[52] U.S. Cl. ..... 317/234 R, 317/234 G, 317/234 L, 317/234 M, 317/234 N, 29/580

[51] Int. Cl. ............................ H01l 3/00, H01l 5/00

[58] Field of Search ......................... 317/234, 5, 5.3, 317/5.2, 5.4, 4; 29/574, 580, 589

[56] References Cited

UNITED STATES PATENTS

| | | | |
|---|---|---|---|
| 3,000,085 | 9/1961 | Green | 317/234 |
| 3,190,954 | 6/1965 | Pomerantz | 317/234 |
| 3,231,797 | 1/1966 | Koch | 317/234 |
| 3,409,974 | 11/1968 | Lueck et al. | 317/235 |
| 3,525,146 | 8/1970 | Hayashida et al. | 317/234 |
| 3,551,997 | 1/1971 | Etter | 317/234 |

*Primary Examiner*—John W. Huckert
*Assistant Examiner*—Andrew J. James
*Attorney*—George J. Porter

[57] ABSTRACT

A electronic device including lead attachment structure which permits operation of the devices over a wide temperature range. The device comprises a core conductor having a thin coating of metal thereon whereby only a limited amount of coating material is available to form an alloy which bonds the core conductor to the device electrode, the electrode composition thus being affected only in the region adjacent the lead and the bond between the electrode and device being unaffected.

2 Claims, 7 Drawing Figures

WIDE TEMPERATURE RANGE ELECTRONIC DEVICE WITH LEAD ATTACHMENT

CROSS REFERENCE TO RELATED APPLICATIONS

The invention described herein is a division of application Ser. No. 868,775, filed Oct. 23, 1969, now U.S. Pat. No. 3, 665,589, dated May 30, 1972.

ORIGIN OF THE INVENTION

The invention described herein was made by an employee of the U.S. Government and may be manufactured and used by or for the Government for governmental purposes without the payment of any royalties thereon or therefor.

BACKGROUND OF THE INVENTION

1. Field of the Invention

The present invention relates to lead attachment to electronic devices. More specifically, the present invention is directed to bonds, between conductors and devices, which are mechanically and electrically reliable over wide temperature ranges. Accordingly, the general objects of the present invention are to provide novel and improved articles of such character.

2. Description of the Prior Art

While not limited thereto in its utility, the present invention has been found to be particularly well suited for the joining of leads to semiconductor devices. Accordingly, for purposes of explanation, the present invention and the prior art will be described with relation to the fabrication of high-temperature solid state devices such as rectifier diodes, tunnel diodes and backward diodes.

In considering the prior art, reference may be had to FIGS. 1–5A of the drawing of the present application. The accepted procedure for producing alloyed junctions in host semiconductor material, in the course of fabrication of solid state diodes of the types above mentioned, may be considered as starting with the positioning of a small fragment or dot of electrode material on a host chip of semiconductor material of the desired conductivity type. The dot or fragment will typically be comprised of a material which, when in the molten condition, can dissolve a portion of the host semiconductor chip. The dot of electrode material will initially include or will be caused to absorb a small percentage, typically less than 2 percent, of an impurity which, if present in the host semiconductor material, would cause the chip to exhibit the opposite conductivity characteristics. FIG. 1 of the drawing depicts the fragment of electrode material on the surface of the host chip. The second step in the junction formation is to heat the chip and fragment of electrode material to a predetermined temperature greater than the melting point of the electrode material. The molten electrode material will thereupon dissolve a portion of the semiconductor chip as shown in FIG. 2. Upon cooling, a portion of the dissolved semiconductor material will come out of solution and regrow. The regrown semiconductor material will have incorporated in its lattice a sufficient quantity of the opposite conductivity impurity which was present in the electrode material so as to convert the regrown material, considering the example where the host chip is p-type semiconductor material, to n-type material as shown in FIG. 3. The resulting p-n junction will perform the electronic function of the semiconductor device. Upon resolidification of the electrode material, the fragment will bond to the host chip. A useful device will, of course, result from mounting the chip in a suitable package and making electrical contact to the host material and to the exposed surface of the electrode material which now constitutes an electrode of the device.

The standard prior art technique for connecting a lead wire to the electrode material has called for placing the lead in mechanical contact with the device electrode and thereafter heating the entire structure until either the electrode material and a portion of the lead wire go into solution with one another or the electrode material melts and wets the wire. In either case, upon cooling of the structure, the wire will be bonded to the electrode. While this manner of attaching leads to device electrodes offers the advantage of simplicity, the prior art lead attachment technique usually resulted in a condition which led to failure when the packaged device was operated over a wide range of temperatures.

The aforementioned undesirable condition, in the typical case where the wire and electrode material go into solution with one another, resulted from the fact that the composition of the electrode would be changed to a eutectic comprised of the wire material and electrode material. The changing of the composition of the electrode has a deleterious effect upon the thermal durability of the bond between the electrode material and the host semiconductor material and this bond will thereafter not withstand temperatures up to the level at which the electrode material went into solution with the host material during formation of the junction.

To review the problem discussed in the preceding paragraph, the materials employed in the fabrication of junction devices in the manner described above must have melting points greater than the maximum temperature at which the device is to be operated. Further, since the thermal coefficients of expansion of the various materials differ, in the interest of minimizing strains resulting from temperature induced volumetric changes, which strains will threaten the mechanical integrity of the bonds, the coefficients of expansion of adjacent bonded materials in the device must be matched to the degree possible. It is known that the electrode material-semiconductor bond will maintain its mechanical integrity for temperatures up to the melting point of the electrode material since the volumetric changes which result from cooling the structure from the molten state of the electrode material during junction fabrication are generally reversible. Restated, if the device survives cooling from the melting temperature of the electrode material, it is likely that it will survive heating back up to this temperature. However, if part of the lead wire is dissolved into the electrode material, the composition of the electrode will change and its physical properties will thus also change. Even though the new electrode composition, comprising a eutectic which includes the lead material, may form a satisfactory bond with the remainder of the lead wire there is no assurance that the bond between the new electrode composition and the host semiconductor material will maintain mechanical stability over as wide a range of temperatures as did the original electrode-semiconductor bond. In the typical case, the temperature coefficients of expansion of the newly formed eutectic and the semiconductor material are sufficiently different so that mechanical integrity of the bond between the electrode and chip may be lost if the packaged device is operated over a wide temperature range. It is to be noted that the coefficient of expansion of the electrode composition which includes the lead material cannot readily be controlled since the prior art offered no means for regulating the amount of lead material which went into solution with the electrode material.

SUMMARY OF THE INVENTION

The present invention overcomes the above-discussed and other problems of the prior art by providing a novel structure for attaching leads to semiconductor devices whereby the resulting devices are operable over a wide temperature range. In general, in accordance with the present invention, the device electrode is contacted with a lead which is a composite of two or more metals. The lead will comprise a core wire formed from a material having a relatively high melting point which has been coated, by electroplating and/or evaporation, with thin layers of one or more other metals. The employment of a thin coating of relatively low melting point material on a core wire limits the amount of material which is available for alloying with the device electrode during the lead bonding step, and only a portion of the electrode material will be involved in the process (i.e., will form a new eutectic with the lead material). Accordingly, the bond between the device electrode and the semiconductor chip will remain as formed.

In accordance with the present invention, a lead material such as molybdenum is coated, typically by electroplating, with a limited quantity of another conductive material such as copper. The amount of coating material on the lead material is limited so as to insure that, when the lead is placed adjacent to the electrode and the device heated to the eutectic melting temperature of the coating and electrode materials, only a small amount of the coating is available to be consumed in the alloying process. The thermally durable bond between the electrode and the host semiconductor material thus remains unaffected. Accordingly, as the process of cooling the structure from the eutectic temperature to the ambient can generally be considered to be reversible, mechanical integrity of the structure will be assured over a range of temperatures from ambient to the coating-electrode material eutectic temperature. The foregoing indicates a good match of expansion coefficients between the materials which are bonded to each other and is evidence that the devices will also survive cooling temperatures considerably below ambient.

BRIEF DESCRIPTION OF THE DRAWING

The present invention may be better understood and its numerous objects and advantages will become apparent to those skilled in the art by reference to the accompanying drawing wherein like reference numerals refer to like elements in the several figures and in which.

DESCRIPTION OF THE PREFERRED EMBODIMENT

In order to facilitate understanding of the present invention, the fabrication of a silicon carbide backward diode will be discussed. It is to be understood, however, that the present invention has utility in the attachment of leads to all types of electronic devices, and particularly to semiconductor devices.

Figure 1:
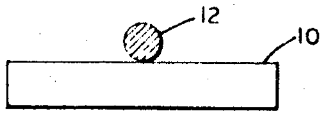
FIGS. 1–4 are side elevation views indicating preliminary steps in the fabrication of an alloy junction semiconductor device in accordance with both the prior art and the present invention.

With references now to FIG. 1, a p-type chip of silicon carbide is indicated at 10. A small fragment or dot 12 of a material which is to be used in formation of both the diode junction and device electrode will be placed on chip 10. In the example being described, where the chip is p-type silicon carbide, the material comprising dot 12 will typically be silicon. The silicon electrode material will at least temporarily be converted into n-type material by the absorption of nitrogen from the surrounding atmosphere when the silicon is molten during the junction fabrication step shown in FIG. 2.

Figure 2:
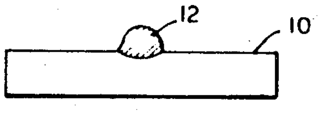
Figure 3:
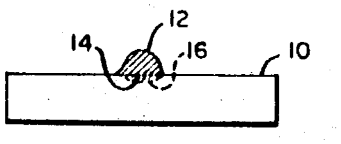

In the step depicted in FIG. 2, the chip and fragment supported on its surface are heated, in a nitrogen atmosphere, to a predetermined temperature greater than the melting point of the silicon fragment 12. The molten silicon will absorb nitrogen from the atmosphere and will dissolve a portion of the host semiconductor chip 10. Upon cooling, a portion of the dissolved semiconductor material will come out of solution and regrow bringing with it enough of the absorbed impurity from the fragment 12, nitrogen in the example being described, to make the regrown silicon carbide n-type as indicated at 14 in FIG. 3. The resulting p-n junction 16 will perform the electronic function of the semiconductor device. Also upon cooling and resolidification, the fragment 12 will be bonded to the surface of chip 10.

Figure 4:
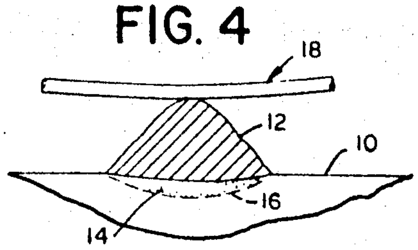
Figure 5A:
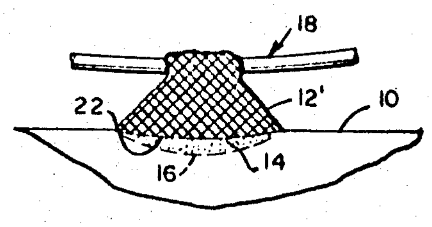
FIG. 5A (PRIOR ART)
FIG. 5A is an enlarged, side elevation view of the bond between a lead and device electrode in accordance with the prior art.
Figures 5B, 6:
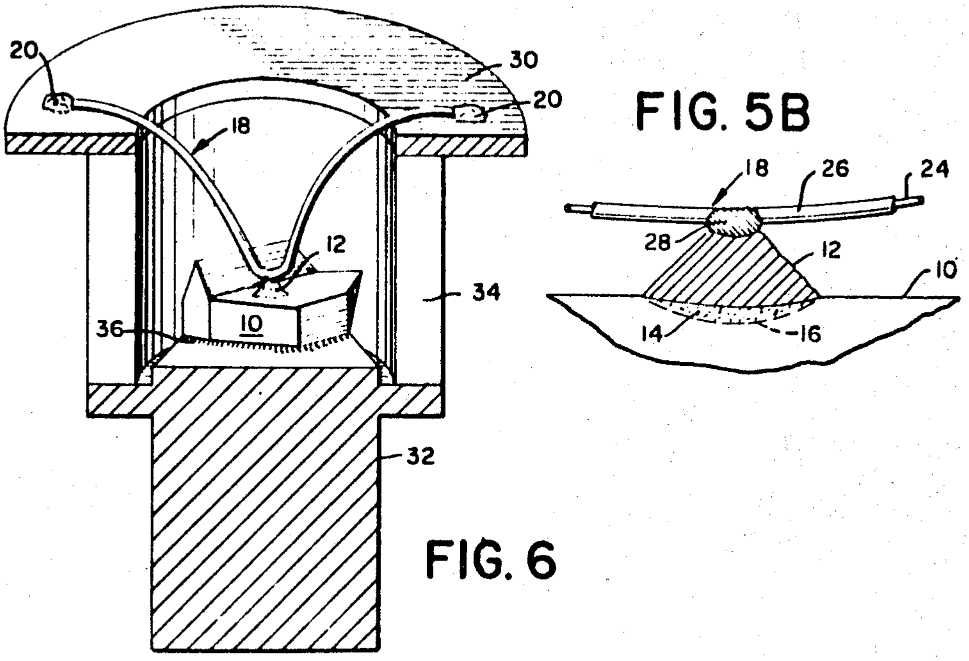
FIG. 5B is an enlarged, side elevation view of the bond between a lead and device electrode in accordance with the present invention.
FIG. 6 is an isometric view, partly in section, of a packaged semiconductor device fabricated in accordance with the present invention.

After fabrication of the p-n junction 16, the chip 10 will be bonded to the base of a package, in the manner shown in FIG. 6, by standard procedures which typically employ a goldtantalum alloy. An operative solid state diode will thereafter result from the attachment of an electrical conductor from a suitable terminal to the fragment 12 which constitutes the device electrode. Typically, the conductor 18 will comprise a wire or ribbon which will be attached by first welding the ends thereof to the rim of a package at two points such as indicated at 20–20 in FIG. 6. The conductor is thereafter manipulated into mechanical contact with the device electrode as shown in FIG. 4.

In accordance with the prior art, conductor 18 would be comprised of a metal chosen for its conductivity and its ability to alloy with the electrode material. Thus, in accordance with the prior art, conductor 18 would typically comprise a gold or nickel wire.

Continuing with a consideration of the prior art, and particularly with respect to FIG. 5A, once the wire 18 had been manipulated into mechanical contact with the electrode 12, the entire structure was heated until either the electrode material and a portion of the wire went into solution with one another or the electrode material melted and wetted the wire. In the usual case, the wire 18 and the electrode material formed a eutectic mixture at a temperature which was lower than the melting point of the electrode 12. As a result of part of wire 18 being dissolved into the electrode material, a new alloy 12' was formed and this new alloy had different physical properties, and particularly a different thermal coefficient of expansion, when compared to the original fragment 12. The new electrode composition 12' formed a reliable mechanical bond with the remaining portions of wire 18. The bond 22 between the new electrode composition 12' and the chip 10 of semiconductor material will not, however, maintain mechanical stability over as wide a range of temperatures as did the original electrode-semiconductor bond. Accordingly, when the resulting device is operated over extreme temperature ranges, device failure will result from the fracture of the bond between the electrode and the host chip caused by temperature induced strains.

In accordance with the present invention, and as may best be seen from FIG. 5B, a composite lead is employed. This composite lead comprises a core wire 24 having a coating 26 thereon. Selection of the material for core wire 24 is dicated by the desire for a core metal which will serve as a conducting path away from the device electrode and which will have sufficient mechanical strength. Further, the core material must have a melting point higher than the maximum desired operating temperature of the device and must not form a eutectic with the coating material at a temperature below the eutectic temperature of the alloy comprising the coating and electrode materials. In the example being described wherein a silicon carbide backward diode is being fabricated, the core wire 24 will typically be comprised of molybdenum which has been coated, for example by electroplating, with coating 26.

The coating 26, which may comprise one or a plurality of layers of metal, will be selected from a material or materials which will combine with the electrode materials to form an alloy as indicated at 28 in FIG. 5B. Alloy 28 serves as a mechanically and thermally stable bond between electrode 12 and the core wire 24. To achieve this bond, it is necessary that the material or materials comprising coating 26 will alloy with the electrode material at a temperature higher than the maximum desired operating temperature of the device but at a temperature lower than the melting or eutectic temperatures of the other constituents of the packaged device. In addition, when alloyed with the material comprising the electrode, the coating material must form an electrically conductive eutectic which is nonbrittle and which wets the core wire 24 so as to bond the core wire to the electrode. In the example being described wherein the electrode material is silicon and the core wire is molybdenum, coating 26 may comprise a thin layer of copper which has been electroplated on the Mo core wire. The thickness of coating 26 must be limited to only that amount necessary for the formation of alloy 28. Restated, the amount of coating 26 available must be limited to only that quantity necessary to go into solution with only a portion of the electrode 12 (to form alloy 28) so as to bond the electrode to the core wire while leaving the remainder of the electrode 12 unaffected and the bond 22 between the electrode and chip as originally formed.

A complete device, fabricated in accordance with the present invention, is shown in FIG. 6. The package depicted in FIG. 6 comprises a flange 30 of nickel-iron having the opposite ends of composite lead wire 18 welded thereto as at 20–20. Conductive flange 30 is displaced from a Mo base post 32 by a cylindrical ceramic insulator 34. The chip 10 is mounted on post 32 by means of a suitable alloy 36.

In accordance with the present invention, a silicon carbide backward diode has been fabricated employing the following materials:

host chip 10 — p-type silicon carbide
electrode material fragment 12 — silicon
n-dopant — nitrogen
bonding alloy 36 — gold-tantalum
lead 18 — molybdenum with electroplated copper coating.

The thickness of the copper coating 26 on molybdenum core wire 24 was approximately 0.0001 inch, the diameter of the core wire 24 was approximately 0.001 inch and the length of contact between the lead 18 and the electrode 12 was typically 0.003 inch. Bonding of the lead to the electrode was accomplished at 800°C with the heating being continued only until alloying of the coating and electrode materials was visually observed. The resulting silicon-copper alloy 28 provided a mechanically and thermally stable bond between the core wire 24 and electrode 12; alloy 28 having a melting temperature of approximately 800°C. The resulting devices have survived exposure to temperatures in the range of −270°C to +700°C.

While a preferred embodiment has been shown and described, it is to be understood that various modifications and substitutions may be made thereto without departing from the spirit and scope of the present invention. Accordingly, it is to be understood that the present invention has been described by way of illustration and not limitation.

What is claimed is:

1. A wide temperature range electronic circuit device comprising:

a chip of semiconductor material;
an electrode comprising a fragment of semiconductor material bonded to an active portion of said chip;
a lead comprising a coated core wire;
a eutectic formed from the lead coating and the electrode material, said eutectic bonding said core wire to said electrode; said coated core wire comprising:
1. a thin conductive coating of precisely limited thickness on said core wire, said coating comprising a first material having the characteristic that it will alloy with the material comprising the electrode to form said eutectic at a temperature above the maximum operating temperature of the device;
2. a conductive core wire, said wire comprising a second material which will not alloy with the said coating at a temperature below the melting point of said eutectic.

2. The electronic circuit device of claim 1 wherein said coating on said core wire is precisely limited in thickness to an amount sufficient to bond said core wire to said electrode but insufficient to affect the existing bond between said electrode and said chip.

* * * * *